(12) United States Patent
Buvid et al.

(10) Patent No.: US 9,869,983 B2
(45) Date of Patent: Jan. 16, 2018

(54) COOLING SYSTEM LEAK DETECTION

(71) Applicant: International Business Machines Corporation, Armonk, NY (US)

(72) Inventors: Daniel J. Buvid, Rochester, MN (US); Eric J. Campbell, Rochester, MN (US); Tyler Jandt, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 14/561,591

(22) Filed: Dec. 5, 2014

(65) Prior Publication Data

US 2016/0161952 A1 Jun. 9, 2016

(51) Int. Cl.
*G05B 15/02* (2006.01)
*G01M 3/40* (2006.01)
*H05K 7/20* (2006.01)
*H05K 1/02* (2006.01)

(52) U.S. Cl.
CPC ............ *G05B 15/02* (2013.01); *G01M 3/40* (2013.01); *H05K 1/0201* (2013.01); *H05K 7/20218* (2013.01); *H05K 2201/064* (2013.01)

(58) Field of Classification Search
CPC .................................................. G05B 15/02
USPC ......................................................... 700/282
See application file for complete search history.

(56) References Cited

U.S. PATENT DOCUMENTS

| | | | |
|---|---|---|---|
| 4,918,977 A | 4/1990 | Takahashi et al. | |
| 5,378,995 A | 1/1995 | Kudo et al. | |
| 6,550,499 B1 * | 4/2003 | Pai | F16L 11/12 |
| | | | 138/104 |
| 6,650,125 B1 * | 11/2003 | Youngquist | G01M 3/18 |
| | | | 324/559 |
| 6,734,674 B1 * | 5/2004 | Struse | G01M 3/18 |
| | | | 324/326 |
| 7,142,425 B2 | 11/2006 | Tomioka et al. | |
| 7,405,578 B2 | 7/2008 | Mikael | |

(Continued)

FOREIGN PATENT DOCUMENTS

| | | |
|---|---|---|
| EP | 0246657 B1 | 4/1991 |
| EP | 1522838 A3 | 10/2006 |

(Continued)

OTHER PUBLICATIONS

Dearmond et al., "Anastomotic leak detection by electrolyte electrical resistance," PubMed.gov, J Invest Surg., Aug. 23, 2010, pp. 197-203 DOI: 10.3109/08941930903469458.

(Continued)

*Primary Examiner* — Chun Cao
(74) *Attorney, Agent, or Firm* — Nicholas D. Bowman

(57) ABSTRACT

A cooling system cools one or more electrical components on a printed circuit board. A piece of bilayer tubing made of an electrically conductive outer layer and an insulating inner layer. The insulating inner layer separates an electrically conductive coolant fluid from the electrically conductive outer layer. A signal generator is configured to inject an electrical signal into the electrically conductive coolant fluid. A sensor circuit electrically connected to the conductive outer layer is configured to detect the signal in the electrically conductive outer layer.

8 Claims, 3 Drawing Sheets

(56) References Cited

U.S. PATENT DOCUMENTS

| | | | |
|---|---|---|---|
| 8,087,430 B1* | 1/2012 | Betz | F16L 11/12 138/104 |
| 8,208,258 B2 | 6/2012 | Campbell et al. | |
| 2003/0188830 A1* | 10/2003 | Narendrnath | C23C 16/4586 156/345.51 |
| 2006/0187638 A1* | 8/2006 | Vinson | G06F 1/20 361/698 |
| 2007/0194792 A1 | 8/2007 | Quackenbush et al. | |
| 2008/0246621 A1* | 10/2008 | Wu | G01M 3/16 340/605 |
| 2011/0120576 A1* | 5/2011 | Sigouin | F16L 9/19 137/551 |
| 2012/0247566 A1* | 10/2012 | Moussavi | F16L 9/14 137/1 |
| 2013/0003501 A1* | 1/2013 | Marquez | G01M 3/40 367/83 |
| 2016/0120059 A1 | 4/2016 | Shedd et al. | |

FOREIGN PATENT DOCUMENTS

| | | |
|---|---|---|
| JP | 57090149 A | 6/1982 |
| JP | 57090149 U | 6/1982 |
| JP | 58225336 A | 12/1983 |
| WO | 2011143384 A1 | 11/2011 |

OTHER PUBLICATIONS

Houston, S., "Ammonia Leak Detection in CA Storage," 14th Annual Postharvest Conference, Washington State University, Mar. 10-11, 1998, Yakima, Washington.

Shankland, S., "How IBM is making computers more like your brain. For real," CNET, Oct. 17, 2013, © CBS Interactive Inc.

* cited by examiner

COOLING SYSTEM LEAK DETECTION

BACKGROUND

The present disclosure relates to detecting coolant leaks to prevent damage associated with coolant making contact with electrical components. Electrical components may be susceptible to damage when they overheat. Cooling systems may be configured to remove waste heat generated by electrical components to help them operate more efficiently and to increase their functional lifespan. Electrical components may be susceptible to damage when directly exposed to coolant that leaks from coolant systems. Such damage may include arcing, short circuits, and corrosion.

SUMMARY

Certain embodiments are directed toward a cooling system that can cool one or more electrical components on a printed circuit board. The cooling system may include a piece of bilayer tubing comprising an electrically conductive outer layer and an insulating inner layer configured to electrically separate an electrically conductive coolant fluid from the electrically conductive outer layer. A signal generator may be configured to inject an electrical signal into the electrically conductive coolant fluid. A sensor circuit, electrically connected to the electrically conductive outer layer, may be configured to detect the signal in the electrically conductive outer layer.

Some embodiments may be directed toward a method of detecting leaks in a cooling system connected to a printed circuit board, comprising: connecting a cooling system with a piece of bilayer tubing to an electrical component, the piece of bilayer tubing having an electrically conductive outer layer and an insulating inner layer, the insulating inner layer configured to hold an electrically conductive coolant fluid; configuring a signal generator to inject a signal into an electrically conductive coolant fluid within the insulating inner layer; and electrically connecting a sensor circuit to the electrically conductive outer layer to detect the signal in the electrically conductive outer layer.

Other embodiments may be directed toward a method of using a sensor circuit configured to measure a signal in an electrically conductive outer layer of a piece of bilayer tubing to detect a leak (originating from within an insulating layer of the bilayer tubing) in a cooling system connected to a printed circuit board. A signal may be injected into an electrically conductive coolant fluid within the insulating inner layer; and the signal may be measured in the electrically conductive outer layer of the piece of bilayer tubing using a sensor in the sensor circuit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
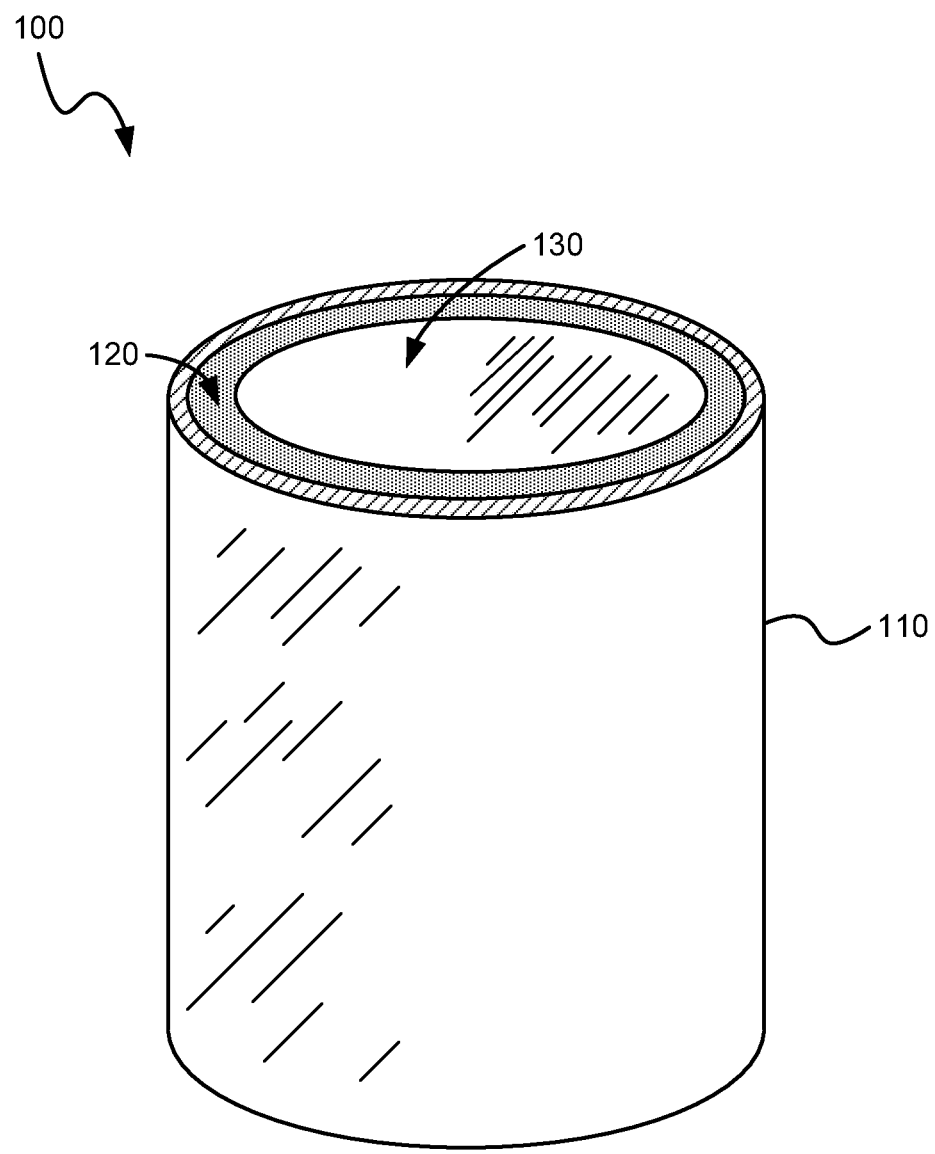
FIG. 1 shows a piece of bilayer tubing, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention, using the described examples as guidelines to the scope of the invention.

DETAILED DESCRIPTION

Aspects of the present disclosure relate to thermal regulation of electrical components, and more particular aspects relate to methods of detecting leaks from cooling systems used in proximity with electrical components, circuit boards, integrated circuits and stacked chips or three-dimensional (3D) chips. A cooling system that cools one or more electrical components may have pieces of bilayer tubing that insulate, using an insulating inner layer, an electrically conductive outer layer from an electrically conductive coolant fluid. A signal generator may be configured to inject an electrical signal into the electrically conductive coolant fluid. A sensor circuit connected to the electrically conductive outer layer of the bilayer tubing may detect the presence of the electrical signal in electrically conductive outer layer when coolant leaks out of the cooling system. While the present disclosure is not necessarily limited to such applications, various aspects of the disclosure may be appreciated through a discussion of various examples using this context.

Leaks of coolant from cooling systems may cause damage in electrical components cooled by those cooling systems. Examples of electrical components may include printed circuit boards, resistors, capacitors, integrated circuits, and stacked chips or three-dimensional (3-D) chips. Rapid detection of coolant leaks may minimize or even prevent damage to such electrical components. Cooling may leak from cooling systems at many locations, including tubing, heat exchangers, pumps, and valves. Perhaps the most common location for a leak is at the intersection between two cooling system components, such as the location where a piece of tubing mates with a valve or pump. Leaks may be caused by breakdown of materials due to age or chemical exposure, damage caused by vibrations, or cracks formed as a result of thermal cycling.

In some embodiments of cooling systems, liquid coolant is pumped through a heat exchanger that draws heat from a computing system. In other embodiments of cooling systems, a heat exchanger may be placed near or on a heat producing electrical component, such as an integrated circuit, in order to increase the efficiency of the cooling system by capturing the heat produced by the electrical component at its source. Some integrated circuits may benefit from direct mounting of a heat exchanger (or, from direct cooling by a cooling system) more than others. Stacked chips or three-dimensional chips, such as integrated circuits formed by layering discrete integrated circuit chips on top of each other and electrically connecting them to each other to form a larger integrated circuit, may benefit greatly from direct cooling. This greater benefit may arise from the fact that the greater volume of a stacked chip or three-dimensional chip may make it more difficult to dissipate heat from the interior of the structure as compared to, for example, a single layer integrated circuit which may have a relatively high ratio of surface area to chip volume.

Rapid leak detection may be accomplished using an electrical signal transmitted through the cooling system to a sensor circuit when a leak is present. In some embodiments of cooling systems configured for rapid leak detection, bilayer tubing may be used in order to perform the rapid leak detection. If an electrical current is applied to electrically conductive coolant fluid circulating in the cooling system, the electrical current may act as an electrical signal that can be detected in an electrically conductive outer layer of the piece of bilayer tubing when a leak allows the coolant to touches the outer layer of tubing. A sensor circuit connected to the outer layer may then detect the signal. The signal may directly convey information about cooling system leaks (i.e., that a leak has occurred) to a processor circuit, or may convey information about the location of a leak in the system, according to which electrical pathway is energized by the coolant leak transmitting electrical current (an electrical signal) into the electrically conductive outer layer.

FIG. 1 shows a piece of bilayer tubing 100 according to embodiments of the present disclosure. The bilayer tubing 100 may have an electrically conductive outer layer 110 and an insulating inner layer 120. The electrically conductive outer layer 110 may be made of a metal such as brass, copper, stainless steel, other types of metals, electrically conductive polymers, or other types of electrically conductive materials. The insulating inner layer 120 may be thermally insulating to some degree (and the degree of thermal insulation may be varied according to specifications of particular embodiments of cooling systems in the cooling loads that they face) as well as electrically insulating. The insulating inner layer 120 may be made of rubber, nylon, polyethylene, polypropylene, fluoropolymers, or some other electrically insulating material that can provide a barrier to signal transmission from a signal generator to the electrically conductive outer layer 110.

The insulating inner layer 120 may have an opening 130 inside it through which an electrically conductive coolant fluid may flow in order to perform the cooling function of cooling system. According to embodiments, the insulating inner layer 120 may be made of different materials depending on the nature of the electrically conductive coolant fluid that flows within the opening 130. Criteria for determining which insulating inner layer 120 can be paired with a particular electrically conductive coolant fluid may include chemical resistance and thermal properties.

The electrically conductive coolant fluid may contain water and may contain organic compounds commonly used as coolants such as ethylene glycol in varying proportions with the water. The organic compounds such as ethylene glycol that may be used in cooling solution may be poor conductors of electrical current. The water in cooling solutions may be distilled water or deionized water or may be treated in some manner in order to minimize, regulate, or control the amount of dissolved minerals present in the water. Water in cooling systems may be distilled or deionized in order to reduce or prevent mineral deposit buildup in cooling lines, and to lessen the likelihood of corrosion. Dissolved minerals may include, but not be limited to, compounds such as calcium carbonate, magnesium carbonate, sulfates, nitrates, and phosphates.

Cooling solutions may be treated with compounds that prevent or slow the growth of algae and bacteria in the cooling system in order to reduce the potential for clogged cooling lines and to lessen the frequency of system maintenance. A cooling solution may be also treated with some combination of chemicals to create a buffered solution that can conduct electrical current to signal the presence of a leak in the cooling system. A buffered solution may transmit a signal through the solution to another part of the cooling system without reducing the overall concentration of electrolytes in the buffered solution. A buffered solution may include the salt of a complimentary weak acid or weak base. The salt may be an organic salt or an inorganic salt. For example, a buffered solution may be made using an organic salt such as sodium acetate and a weak acid such as acetic acid. In other embodiments, a buffered solution may include a carbonate such as ammonium carbonate, or a phosphate such as sodium hydrogen phosphate. Other non-limiting examples include an electrolyte solution that have a predetermined conductivity greater than 5 S/m (siemens per meter), but can vary depending on the application.

Figure 2:
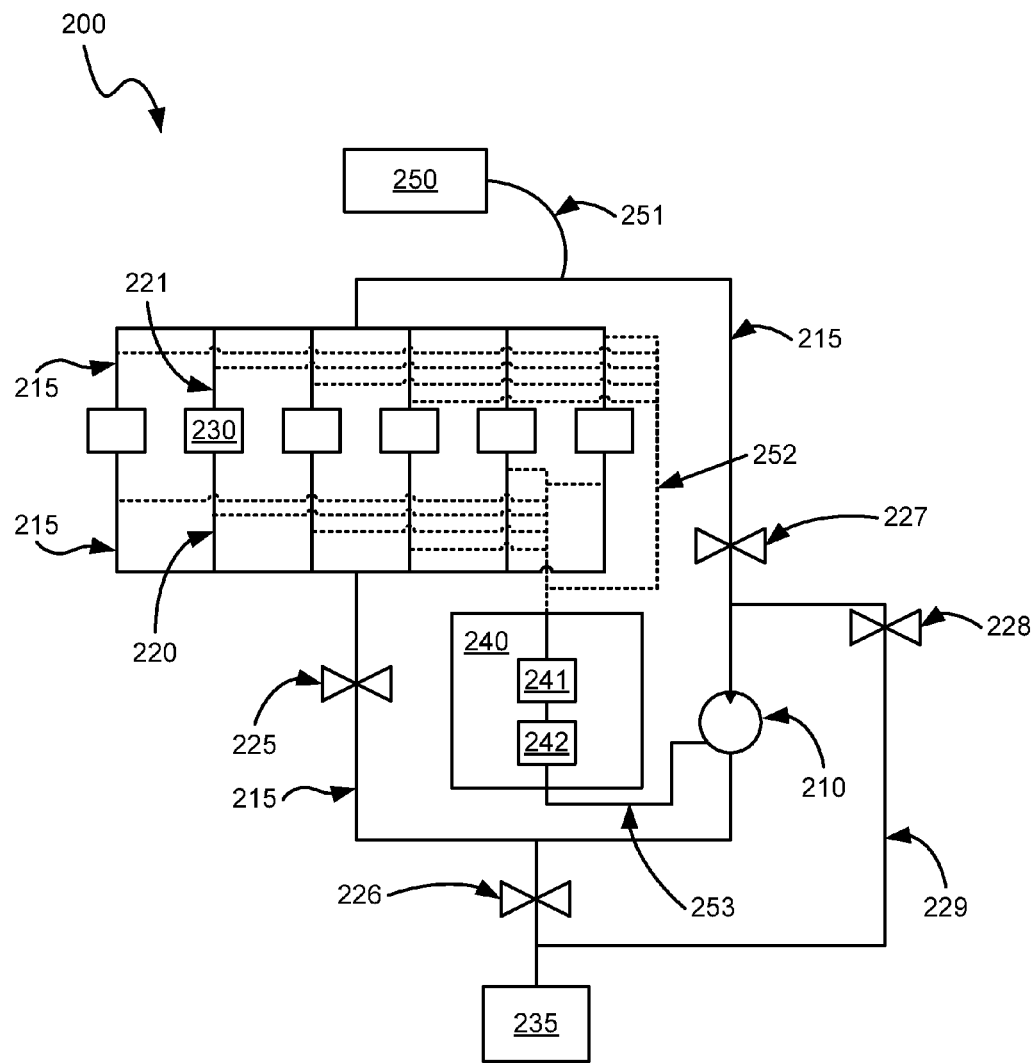
FIG. 2 shows a cooling system configured to cool electrical components, according to embodiments.

FIG. 2 shows an embodiment of a cooling system 200 that contains bilayer tubing configured for rapid leak detection, according to embodiments. The cooling system 200 may contain a coolant pump 210 and a cooling loop 215 which extends from an outlet on the cooling pump 210 through a heat exchange element 230 and back to an inlet on the cooling pump 210. There may be a single heat exchange element 230 in contact with some electrical component that produces waste heat, or there may be a manifold in the cooling loop 215 with multiple heat exchanging elements configured to draw waste heat from several electrical components, such as power supplies, integrated circuits, transformers, etc. The cooling loop 215 may have one or more valves 225, 227 that can isolate heat exchange elements from the coolant pump 210 or the remainder of the cooling system 200.

At various positions within the cooling loop 215, which may include portions of the cooling loop entering or exiting a heat exchange element 230, there may be one or more pieces of bilayer tubing configured for rapid leak detection. A piece of bilayer tubing 221 attached to the heat exchanger element 230 may facilitate leak detection at the tubing/inlet interface. A similar configuration between another piece of bilayer tubing 220 at the outlet side of a heat exchange element 230 may facilitate leak detection at the other heat exchanger interface. When heat exchangers are near electronic components, rapid leak detection may reduce or prevent damage to these components.

Cooling system 200 may have a signal generator 250 connected, using a wire or antenna 251, to electrically conductive coolant fluid within the cooling loop 215 in order to inject a signal into the cooling system to facilitate detection of leaks when they occur. The signal may be input into the cooling system by one or more signal generators and may be a voltage input applied to the electrically conductive coolant fluid within the cooling loop 215. The voltage input may be used to supply power to some electrical components attached to the cooling system. The voltage may be applied by putting an electrical lead in contact with the electrically conductive coolant fluid within the cooling loop 215. In some embodiments, the electrical lead may be inserted into part of a piece of bilayer tubing, while in other embodiments the electrical lead may be inserted into a coolant fluid reservoir filled with electrically conductive coolant fluid. The voltage may be applied according to a voltage profile, which may include a constant voltage, or a voltage that varies according to system parameters such as operating time or the number of devices connected to and cooled by the cooling system. In some embodiments, the voltage may be constant, while in others, the voltage may be stepped or switched between multiple voltages.

The electrical components cooled by the cooling system may be protected from the applied voltage or electrical current being conducted through the coolant by coating the components with superhydrophobic coatings. Superhydrophobic coatings can prevent liquids from wetting solids that are coated. By preventing wetting, the amount of liquid in contact with the surface can be greatly reduced. In some instances, superhydrophobic coatings may prevent coated surfaces from being wetted by liquids at all, eliminating the chance that electrical current can flow to or through the component from the liquid. A cooling system may be prepared by filling the system with electrically conductive coolant fluid, and then configuring the signal generator to inject the signal (an electrical current or voltage) into the coolant fluid for detecting leaks.

The cooling system 200 may also contain a sensor circuit 240 that is electrically connected to the electrically conductive outer layer of pieces of bilayer tubing in order to detect leaks. A sensor circuit 240 may contain a sensor or a detector 241 and a processor circuit 242. A sensor 241 may measure a signal from a signal generator that is transmitted through electrically conductive coolant fluid, the electrically conductive outer layer of bilayer tubing, and a signal detection wiring harness 252. The sensor 241 may then transmit information about the presence of the signal in the electrically conductive outer layer to the processor circuit 242. In some embodiments, there may be multiple sensors 241, each of which may be connected to a portion of the cooling loop, such as the portions feeding into or exiting from a single heat exchange unit 230 (i.e., pieces of bilayer tubing 220 and 221). A sensor 241 may be a voltage sensor or a current sensor, according to embodiments of the present disclosure.

A processor may receive the electrical signal and generate error codes, leak response commands, and other system commands based upon the detection of the signal. The system-protecting action may be different according to what portion of a cooling system is experiencing a leak. For instance, a server in the middle of a fully populated rack may experience a leak in a liquid coolant system during normal operation. The system-protecting action (leak response action) may include, for this scenario, an instruction to turn off electrical power to the server that is experiencing the leak, as well as all servers located beneath that server in the rack, in order to reduce the risk of damage. In other scenarios, the leak response action may include the following: to turn off pumps (using, e.g., a power circuit configured to regulate the electric current provided to a pump) to stop coolant flowing through the cooling system from leaking, to isolate portions of the cooling system from each other using shutoff valves in the cooling system loop, purge coolant from cooling system lines using pumps, gravity drains, and compressed gasses, and to sound audible alarms according to instructions loaded into the processor.

The sensor circuit may be configured to transmit a leak response using a signal transmission line 253. In some embodiments, signal transmission line may connect the sensor circuit to the coolant pump 210, while in other embodiments, the signal transmission line 253 may connect to one or more valves 225, 227 that control flow of electrically conductive coolant fluid within the cooling loop 215, or to valves 226 and 228 which may serve to connect/isolate a purge line 229 from the remainder of the cooling loop 215. A holding tank 235 may be connected to the purge line 229 in order to capture electrically conductive coolant fluid that is drained or purged from the cooling loop 215.

In some embodiments, the sensor circuit 240 may contain a processor 242 that may be programmed to receive an input from a user to select a preferred leak response action upon detection of the signal when a leak occurs. The processor may be configured to perform a single leak response action, or may be configured to perform multiple leak response actions which may be sequential or simultaneous, according to the input received from a user. According to embodiments, the processor may be instructed to select among leak response actions by manually selecting leak responses by adjusting physical switches and timers, or the processor may be an integrated circuit that stores or receives electronic instructions to perform in the event of a coolant leak.

As described in FIG. 1, a piece of bilayer tubing has electrically conductive outer layer and an electrically insulating inner layer. The insulating inner layer acts as a barrier to the electrical signal provided by a signal generator connected to the cooling loop 215. When a leak occurs in the cooling loop 215, the signal detection wiring harness 252 may be configured such that each piece of bilayer tubing can be identified individually to identify the location of the leak. This may involve multiple detectors within the sensor circuit 240, or may include the addition of other electrical components (e.g., resistors, etc.) in the signal detection wiring harness such that the signal may be modified by transmission through the signal detection wiring harness to the sensor circuit to allow identification of unique segments of bilayer tubing.

Figure 3:
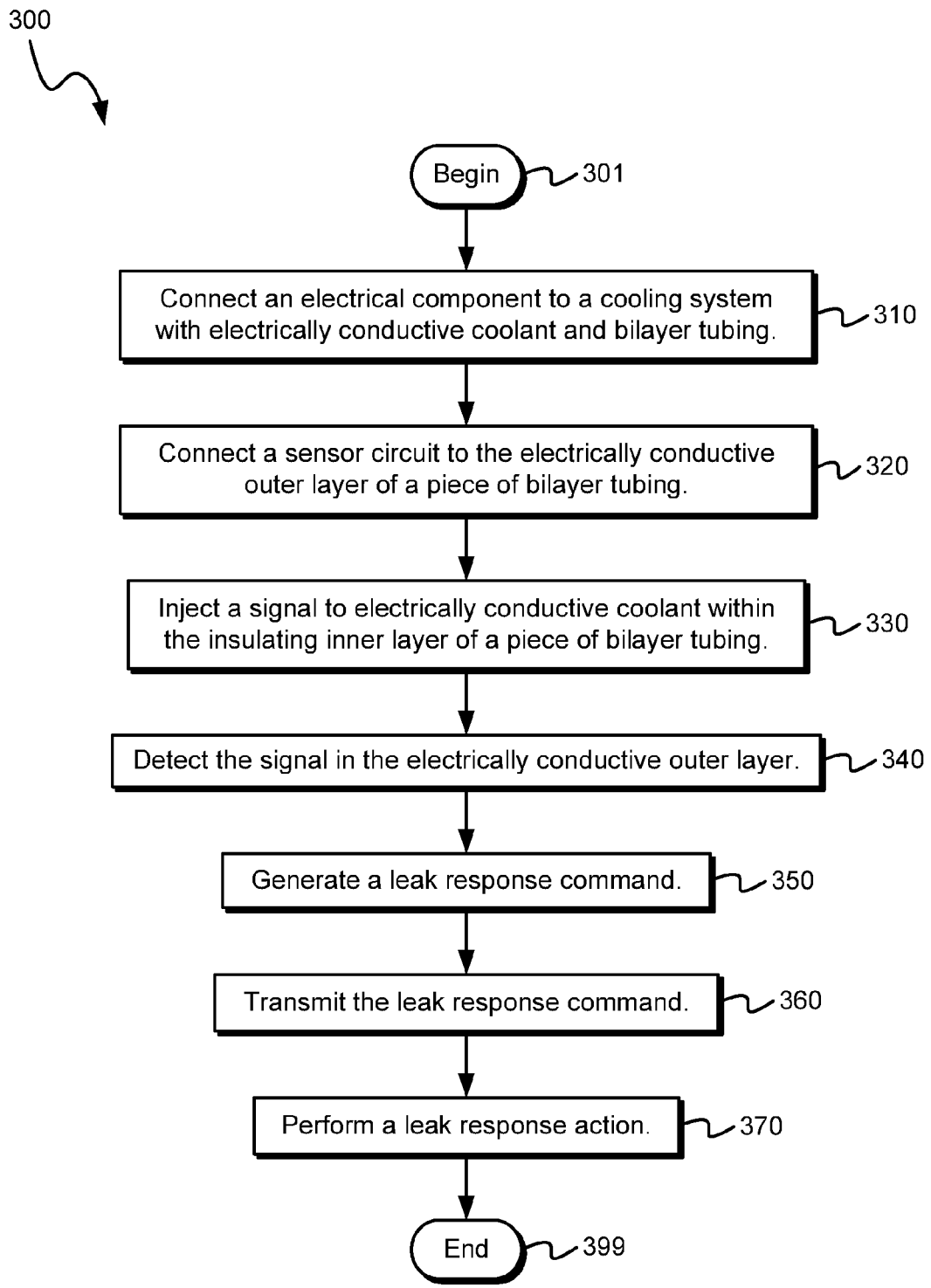
FIG. 3 describes a method of detecting leaks using a cooling system having bilayer tubing, according to embodiments.

FIG. 3 describes a method 300 for detecting leaks in cooling systems. The method includes a step wherein an electrical component is fastened to a cooling system having an electrically conductive coolant fluid and bilayer tubing, as indicated in block 310. The electrical component may be an integrated circuit, whether a single layer integrated circuit or a stacked/three-dimensional integrated circuit, a power supply, or other part of an electrical circuit that generates waste heat. As described in FIG. 2, the cooling system may have a heat exchange element fitted with bilayer tubing. The heat exchanger element may be placed in close proximity to the electrical component, such as mounting a heat exchanger on top of an integrated circuit and applying a thermally conductive paste between the integrated circuit and the exchange element in order to enhance the removal of waste heat from the integrated circuit.

The method may also include connecting a sensor circuit to an electrically conductive outer layer of a piece of bilayer tubing, as indicated in block 320. As described previously, the insulating inner layer in the bilayer tubing may hold an electrically conductive coolant fluid while physically isolating the electrically conductive coolant fluid from the electrically conductive outer layer of the bilayer tubing. The outer layer may be connected to a sensor circuit or a detector in the sensor circuit using a wiring harness configured to transmit an electrical signal.

The method may also include injecting a signal into the electrically conductive coolant fluid within the insulating inner layer of bilayer tubing, as described in block 330. The signal may be created by a signal generator such as a fixed voltage source or more complex signal generator that can create a signal with multiple voltages and may switch between those voltages. The signal may be transmitted from the signal generator to the electrically conductive coolant fluid by, for example, sending the signal down a wire and immersing a portion of the wire into a reservoir containing electrically conductive coolant fluid that is being circulated through a cooling loop in the cooling system.

The method may also include a step wherein the signal is detected in the electrically conductive outer layer, as indicated in block 340. As previously discussed, detection of the signal in the electrically conductive outer layer may occur when a portion of the electrically conductive coolant leaks out of the insulating inner layer and makes physical contact with the electrically conductive outer layer. This may occur when the inner layer has cracks or fractures that may be produced by thermal cycling or vibrational strain that may provide an early warning in the cooling system indicating that preventative maintenance may be performed. The electrically conducting coolant fluid may also make contact with the outer layer of the bilayer tubing when coolant leaks out of the tubing entirely and is on the outer surface of the tubing. Because the signal is an electrical signal and does not rely on measuring the amount of coolant that has leaked from inside the bilayer tubing, even small amounts of electrically conductive coolant fluid may suffice to transmit the signal from the signal generator to the sensor circuit to trigger a warning that a leak has occurred. Similarly, because the signal is electrical, when leaks in cooling systems with electrically conductive coolant fluid occur, the signal may be transmitted quickly to trigger a leak response, rather than waiting for a wick or other type of sensor to be wetted by the coolant to trigger a warning.

Upon detecting the signal in the electrically conductive outer layer, a leak response command may be generated, as described in block 350. The leak response command may be generated by a portion of the sensor circuit that is hardwired to the signal detectors, or may be generated by a processor such as an integrated circuit that has been configured to generate a leak response command that can be transmitted to other parts of the cooling system such as valve actuators or electrical controllers. The method may include transmitting the leak response command, as indicated in block 360, and performing a leak response action as described in block 370. The method ends in block 399.

A leak response command may be a simple electrical signal transmitted to another part of the cooling system, or may be a complex signal transmitted by, e.g., an integrated circuit (the processor, or processor circuit) to a system control processor or a general-purpose computing device that can send email messages, sound alarms, and trigger other responses upon the detection of the leak. One example of a leak response action may include turning off electrical power to the electrical components being cooled by the cooling system in order to prevent arcing, short circuits, or other electrical damage. In other embodiments, a leak response action may include turning off one or more coolant pumps in the cooling system (in order to reduce the potential size of the leak), manipulating valves in the cooling system in order to isolate parts of the system from each other (i.e., shutting down cooling to one server or one printed circuit board in a rack of electrical components while allowing full coolant flow through adjacent servers or printed circuit boards), and triggering a purging process where a purging element such as a compressed air system, a pump, or a drain valve is actuated in order to eliminate coolant from the leaking portion of a cooling loop. In embodiments where a purging process may occur, a holding reservoir may be connected to the system and may have a separate set of actuator valves that can be opened or closed in order to facilitate collection of the electrically conductive coolant fluid. In further embodiments, an electrical pump may be used to return the electrically conductive coolant fluid to the cooling system once the leak has been fixed.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A cooling system supporting one or more electrical components on a printed circuit board, comprising:
    a piece of bilayer tubing comprising:
        an electrically conductive outer layer; and
        an insulating inner layer configured to electrically separate an electrically conductive coolant fluid from the electrically conductive outer layer;
    a signal generator configured to inject a electrical signal into the electrically conductive coolant fluid;
    a sensor circuit electrically connected to the electrically conductive outer layer and configured to detect the signal in the electrically conductive outer layer;
    a processor circuit within the sensor circuit, the processor circuit being configured to generate a leak response command in response to detecting the signal in the electrically conductive outer layer; and
    a power circuit, wherein the leak response command is received by the power circuit and causes the power circuit to turn off electrical power to an electrical component.

2. The system of claim 1, further comprising:
    a coolant pump configured to turn off upon receiving the leak response command.

3. The system of claim 1, further comprising a shutoff valve being electrically connected to the processor circuit and being configured to stop a flow of electrically conductive coolant fluid upon receiving the leak response command.

4. The system of claim 1, further comprising a purging element configured to purge the cooling system upon receiving the leak response command.

5. The system of claim 4, further comprising a holding reservoir configured to receive purged electrically conductive coolant fluid.

6. The system of claim 1, wherein the electrically conductive coolant fluid is a buffered solution.

7. The system of claim 1, wherein the electrically conductive coolant fluid includes an inorganic salt.

8. A method of detecting, using a sensor circuit that is configured to measure a signal in an electrically conductive outer layer of a piece of bilayer tubing, a leak in a cooling system connected to a printed circuit board, the leak in a cooling system originating from within an insulating inner layer of the piece of bilayer tubing, the method comprising:
    injecting a signal into an electrically conductive coolant fluid within the insulating inner layer;
    measuring, using a sensor in the sensor circuit, the signal in an electrically conductive outer layer of the piece of bilayer tubing;
    sending, responsive to measuring the signal, information about the signal to a processor circuit in the sensor circuit;
    generating, responsive to transmitting the signal, a leak response command in the processor circuit;

sending, responsive to generating the leak response command, the leak response command to a system component; and performing a leak response action, wherein the leak response action is selected from the group consisting of:
  turning off electrical power to the system component;
  turning of a coolant pump on the cooling system;
  closing a shutoff valve in the cooling system; and
  purging the cooling system.

* * * * *